United States Patent [19]

Binder et al.

[11] Patent Number: 5,252,436
[45] Date of Patent: Oct. 12, 1993

[54] PROCESS FOR DEVELOPING A POSITIVE-WORKING PHOTORESIST CONTAINING POLY(P-HYDROXYSTYRENE) AND SULFONIUM SALT WITH AN AQUEOUS DEVELOPER CONTAINING BASIC ORGANIC COMPOUNDS

[75] Inventors: Horst Binder, Lampertheim; Reinhold Schwalm, Wachenheim, both of Fed. Rep. of Germany

[73] Assignee: BASF Aktiengesellschaft, Ludwigshafen, Fed. Rep. of Germany

[21] Appl. No.: 976,004

[22] Filed: Nov. 13, 1992

Related U.S. Application Data

[63] Continuation of Ser. No. 615,845, Nov. 20, 1990, abandoned.

Foreign Application Priority Data

Dec. 15, 1989 [DE] Fed. Rep. of Germany ....... 3941394

[51] Int. Cl.$^5$ ............................ G03F 7/30; G03F 7/32
[52] U.S. Cl. ..................................... 430/326; 430/331
[58] Field of Search ................................ 430/326, 331

[56] References Cited

U.S. PATENT DOCUMENTS

| | | | |
|---|---|---|---|
| 4,576,903 | 3/1986 | Baron et al. | 430/331 |
| 4,628,023 | 12/1986 | Cawston et al. | 430/331 |
| 4,678,737 | 7/1987 | Schneller et al. | 430/270 |
| 4,716,098 | 12/1987 | Mack et al. | 430/331 |
| 4,786,580 | 11/1988 | Hsieh et al. | 430/331 |
| 4,808,513 | 2/1989 | Lazarus et al. | 430/331 |
| 4,820,621 | 4/1989 | Tanka et al. | 430/331 |
| 4,833,067 | 5/1989 | Tanaka et al. | 430/331 |
| 4,883,740 | 11/1989 | Schwalm et al. | 430/326 |
| 4,894,311 | 1/1990 | Uenishi et al. | 430/331 |
| 4,904,571 | 2/1990 | Miyashita et al. | 430/331 |
| 4,997,748 | 3/1991 | Takeda et al. | 430/331 |

FOREIGN PATENT DOCUMENTS 124297 11/1984 European Pat. Off. .
231028 8/1987 European Pat. Off. .

*Primary Examiner*—Charles L. Bowers, Jr.
*Assistant Examiner*—Christopher G. Young
*Attorney, Agent, or Firm*—Keil & Weinkauf

[57] ABSTRACT

An aqueous developer suitable in particular for developing photoresists which contain a phenolic resin and an onium salt contains from 0.5 to 5 % by weight of a tetraalkylammonium hydroxide and from 5 to 25% by weight of at least one amine of the general formula

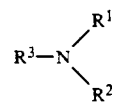

where $R^1$, $R^2$ and $R^3$ are identical or different and each is hydrogen, alkyl, hydroxyalkyl or aminoalkyl, or two of $R^1$ to $R^3$ combine to form a N-containing ring, with at least one of $R^1$ to $R^3$ being hydroxyalkyl or aminoalkyl.

5 Claims, No Drawings

PROCESS FOR DEVELOPING A POSITIVE-WORKING PHOTORESIST CONTAINING POLY(P-HYDROXYSTYRENE) AND SULFONIUM SALT WITH AN AQUEOUS DEVELOPER CONTAINING BASIC ORGANIC COMPOUNDS

This application is a continuation of application Ser. No. 07/615,845, filed on Nov. 20, 1990, now abandoned.

The present invention relates to an aqueous developer system for positive-working photoresists which contains combinations of certain basic organic compounds and to a process for developing photoresists of a certain composition.

In semiconductor technology, small areas in a substrate are changed selectively with photoresists as auxiliary layers. Positive-working photoresists are preferred for this purpose. Using photoresists it is possible to produce relief patterns which bare the surface in certain areas and hence make it accessible to further treatment, such as doping or metallization.

Positive resist patterns are produced by applying a layer of a light-sensitive material to a silicon wafer, irradiating the layer through a structured mask, and selectively removing the irradiated areas with a developer.

Customary light-sensitive compositions are those of alkali-soluble resins, for example of the novolak type, combined with a photosensitive component, for example an o-quinonediazide. The action of UV light dramatically increases the solubility of the composition in alkaline developers in the irradiated areas.

Developers for photoresists based on novolaks are already known. Generally they contain sodium silicates, sodium phosphates, sodium hydroxide, potassium hydroxide and surfactants. EP-A-146,834 and EP-A-231,028 also already disclose developers which contain combinations of quaternary ammonium surfactants and ammonium hydroxides or halogenated (fluorinated) nonionic surfactants and alkali metal hydroxide developers. It is true that these developers are effective in producing a satisfactory contrast, but they show only limited stability and development capacity and insufficient reproducibility for dip development, since the surfactants are quickly consumed.

EP-A-124,297 discloses developers which are free of metal ions but contain tetraalkylammonium hydroxides, e.g. tetramethylammonium hydroxide, tetraethylammonium hydroxide or combinations of various tetraalkylammonium hydroxides, and additions of developer modifiers, e.g. a water-soluble aliphatic ketone, a cyclic ether or a tertiary amine, in an amount of 5-1000 ppm. Further additives mentioned include water-soluble primary amines of 1 or 2 carbon atoms and secondary amines of from 2 to 5 carbon atoms in amounts of from 5 to 500 ppm, e.g. monomethylamine, monoethylamine, dimethylamine, piperazines and piperadines. The disadvantage with these systems is that they give poor contrast and high photoresist depletion in the nonirradiated image areas.

It is an object of the present invention to provide an aqueous alkaline developer which not only does not attack the nonirradiated resist but also makes possible a high contrast and possesses an adequate shelf life.

The developer medium should further satisfy the following criteria: the developer must not contain any metal ions, it must be completely removable after development, it must not attack typical substrate surfaces, such as vapor-deposited aluminum, and it should suppress the surface peeling effect.

We have found, surprisingly, that this object is achieved in a particularly advantageous manner by a developer according to the present invention.

The present invention accordingly provides an aqueous developer with basic organic compounds for a positive-working photoresist containing at least one phenolic resin and at least one onium salt, wherein the basic organic compound content comprises from 0.3 to 5% by weight of a tetraalkylammonium hydroxide having from 1 to 3 carbon atoms in the unsubstituted or hydroxylsubstituted alkyl group and from 3 to 30% by weight of at least one amine of the general formula (I)

where $R^1$, $R^2$ and $R^3$ are identical or different and each is hydrogen, alkyl of from 1 to 3 carbon atoms, hydroxyalkyl of 2 or 3 carbon atoms, or aminoalkyl of 2 or 3 carbon atoms, or two of $R^1$ to $R^3$ combine to form a 5-, 6- or 7-membered N-containing ring, with the proviso that at least one of $R^1$ to $R^3$ is hydroxyalkyl or aminoalkyl.

This developer may also additionally contain up to 5% by weight of an alcohol of 2 or 4 carbon atoms or of a water-soluble glycol ether.

The developer according to the present invention may also contain a mixture of amines of the general formula (I).

Preferably, the aqueous developer according to the present invention contains as amine of the general formula (I) diethanolamine, N-methyldiethanolamine, triethanolamine, an aminopropanol, 3-amino-1-propylamine, 3-dimethylamino-1-propylamine or an N-hydroxyalkylpiperidine.

The present invention also provides a process for developing a positive-working resist which contains as radiation-sensitive layer a mixture of at least one phenolic polymer and at least one sulfonium salt having an acid-labile group, which comprises developing the radiation-sensitive layer with an aqueous developer according to the present invention following imagewise irradiation.

The novel positive resist developer based on an aqueous solution of specific amounts of organic amines of the general formula (I) and tetramethylammonium hydroxide or tetraethylammonium hydroxide has excellent developer properties.

The developer according to the present invention contains in general from 3 to 30% by weight, preferably from 5 to 20% by weight, based on the total amount of developer, of an amine of the general formula (I) and from 0.3 to 5, preferably from 1.0 to 2.0, % by weight of tetraalkylammonium hydroxide.

As modifier it may contain from 0.3 to 5% by weight of an alcohol, such as isopropanol, 1,2-propanediol, or ethanol, or of a water-soluble glycol ether, e.g. butylglycol. Such additions generally lead to an increase in the rate of removal of the irradiated photoresist and can prevent the deposition of contaminants.

The addition of surface-active substances (surfactants) to the developer according to the present invention is in general not necessary. However, such substances may in general be added in amounts of up to 5 percent by weight, based on the total amount of developer, for example nonylphenoxypoly(ethyleneoxy)ethanol, octylphenoxypoly(ethyleneoxy)ethanol or commercially available fluorinated surfactants.

The developer system according to the present invention is particularly suitable for positive resists based on the systems of phenolic polymers and onium salts having acid-labile groups described in DE-A-3 721 741. Preferred onium salts are sulfonium salts of the general formula (II):

where $R^1$ to $R^3$ are identical or different and each is an aromatic or aliphatic radical which may contain hetero atoms, with the proviso that at least one of $R^1$ to $R^3$ contains an acid-detachable group, for example t-butyl carbonates of phenols or silyl ethers of phenols. The aforementioned acid-labile groups are preferred, but a large number of other acid-labile groups can be used, such as the known tetrahydropyranyl ethers, orthoesters, trityl and benzyl groups and also t-butyl esters of carboxylic acids. It is also possible for two or more sulfonium units to link together in the molecule via $R^1$ to $R^3$.

Suitable counterions $X^\ominus$ are preferably complex metal halides, such as tetrafluoroborate, hexafluoroantimonate, hexafluoroarsinate, hexafluorophosphate and triflate ($CF_3SO_3^\ominus$).

The phenolic polymer contains in general units of the general formula (III)

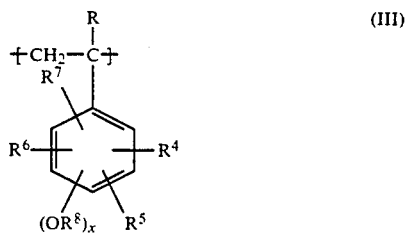

where R is hydrogen, halogen or an alkyl of from 1 to 4 carbon atoms, $R^4$, $R^5$, $R^6$ and $R^7$ are each hydrogen, halogen, or alkyl or alkoxy each of from 1 to 4 carbon atoms, $R^8$ is hydrogen or an acid-labile group, such as trimethylsilyl, t-butoxycarbonyl, isopropoxycarbonyl or tetrahydropyranyl, and x is from 1 to 3, preferably 1.

Preference is given to those polymers of the formula (III) where R is hydrogen or methyl, $R^4$ to $R^7$ are each hydrogen and $R^8$ is hydrogen or an acid-labile group of the aforementioned definition, with —O—$R^8$ being in the p-position and the proportion of groups with $R^8$=hydrogen being not less than 70 mol %.

These polymers have in general average molecular weights ($\overline{M}_n$) within the range from 1000 to 250,000, preferably from 10,000 to 80,000, and are in general present in the radiation-sensitive mixture in a proportion of from 40 to 98, preferably from 60 to 95, % by weight.

The polymeric binders used can also be mixtures of alkali-soluble polymers which contain a high proportion of aromatic groups, namely mixtures of novolaks and substituted poly(p-hydroxystyrenes). Binders having a high aromatic content have the advantage of being relatively stable in plasma and reactive ion beam etch processes.

The developer according to the present invention is also suitable for positive resists based on 3-component systems comprising an alkali-soluble binder, a compound which forms a strong acid under the action of actinic radiation, and a compound having at least one acid-cleavable C—O—C bond, as described for example in DE-A-3,406,927.

The process for producing relief patterns according to the present invention is carried out in a conventional manner, except that it employs the developer according to the present invention. To this end, the mixtures of phenolic resin and/or phenolic polymer and photosensitive component are in general dissolved in an organic solvent, the solids content being within the range from 5 to 40, in particular from 10 to 30, % by weight. Suitable solvents are preferably aliphatic ketones, ethers and esters and also mixtures thereof. Particular preference is given to alkylene glycol monoalkyl ethers, for example ethylcellosolve, butylglycol, methylcellosolve and 1-methoxy-2-propanol, alkylene glycol alkyl ether esters, for example methylcellosolve acetate, ethylcellosolve acetate, methylpropylene glycol acetate and ethylpropylene glycol acetate, ketones, for example cyclohexanone, cyclopentanone and methyl ethyl ketone, and also acetates, such as butyl acetate, and aromatics, such as toluene and xylene. The choice of solvent or of solvent mixture depends on the particular choice of phenolic polymer and photosensitive component.

Furthermore, other additives such as adhesion promoters, wetting agents, dyes and plasticizers may be added.

If necessary, it is also possible to add sensitizers in small amounts in order to sensitize the compounds in the longer wave UV to visible region. Polycyclic aromatics, such as pyrene and perylene are preferred, but it is also possible to use other dyes which act as sensitizers.

The homogeneous solution of the light-sensitive mixture can be filtered through a filter having a pore diameter of about 0.2 μm and be applied to the substrate to be coated—in general a surface-oxidized silicon wafer—in a conventional manner, for example by spin coating at from 2000 to 10,000 r.p.m., producing a light-sensitive layer about 1–2 μm in thickness, which in general is baked at from 80° to 100° C. for from 1 to 10 minutes. The light-sensitive layer is subjected to imagewise irradiation through a structured mask, for example a chromium-coated structured quartz mask in the case of optical lithography, the light sources used being for example UV light from mercury high pressure lamps, cadmium-xenon lamps or excimer laser light, to produce a latent image. Other possible forms of irradiation are X-rays and electron beams. Prior to development the systems based on poly(p-hyroxystyrene)/sulfonium salt should be subjected to a further bake (a postexposure bake) at from 60° to 120° C. for from about 5 seconds to 4 minutes. The light-sensitive layer thus treated is contacted with the developer according to the present invention, either by dipping into the developer or by spraying with the developer, to develop the latent image into a relief pattern by selectively dissolving the irradiated areas while little if any depletion takes place in the nonirradiated areas. After treatment with the developer according to the present invention, the resulting relief is dried and then serves as a mask for further treatment steps, for example etching of the substrate.

The photosensitivity, the gamma value and the depletion ratio of the films were determined after the development process. For positive resist systems the gamma value is defined as $$\Gamma_p = \left[ \log \frac{D_1}{D_0} \right]^{-1},$$

where $D_0$ and $D_1$ are the extrapolated irradiation energy doses from the darkness depletion energy curve.

The thickness of the polymer films was measured with an α-step profilometer from Tencor or an interferometer from Leitz.

The developer according to the present invention exhibits very good properties in respect of the attainable resolution (less than 0.7 μm) and edge steepness. It possesses good development capacity and has a long shelf life.

Following the rinse with deionized water, it was impossible to detect any undesirable residues or deposits on the photoresist patterns or the bared areas of the wafer.

In the Examples, the parts and percentages are by weight, unless otherwise stated.

EXAMPLE 1

A photoresist solution consisting essentially of 16 parts of a poly(p-hydroxystyrene) having an average molecular weight of 25,000 ($\overline{M}_n$ from GPC) as alkali-soluble binder, 5 parts of tris-(4-t-butoxycarbonyloxyphenyl)-sulfonium hexafluoroarsenate as photoactive component and 80 parts of methylpropylene glycol acetate as solvent is applied to a thermally oxidized silicon wafer in a film thickness of 1.0 μm and baked at 90° C. for 1 minute. The substrates thus pretreated are irradiated with shortwave UV light of wavelength 248 nm. Following a postexposure bake at 90° C. for 1 minute, the silicon wafer thus treated was developable in various developer formulations.

Scanning electron micrographs of the photoresist structures showed cleanly developed structures 0.5 μm in width. Their flanks are almost 90°. The surface in the nonirradiated areas is completely smooth and transparent after development; that is, uneven depletion of the nonirradiated resist does not take place.

The results of the investigation are summarized in Table 1.

TABLE 1

| The aqueous developer contains: | | | Results | |
|---|---|---|---|---|
| % of N-(2-hydroxyethyl)-piperidine | % of butyl-glycol | % of TMAH | Sensitivity [mJ/cm²] | % of residual layer | $\Gamma_p$ |
| 5 | 2 | 2.0 | 18 | 11 | 1.5 |
| 5 | 2 | 1.8 | 21 | 7 | 3.1 |
| 5 | 2 | 1.6 | 22 | 1.5 | 3.3 |
| 5 | 2 | 1.4 | 26 | 0.1 | 3.2 |
| 10 | 2 | 1.4 | 20 | 5 | 5.0 |

TMAH = tetramethylammonium hydroxide

EXAMPLE 2

A positive-working photoresist based on a poly(p-hydroxystyrene) and a sulfonium salt and also methylpropylene glycol acetate as solvent is applied to an oxidized silicon wafer in a film thickness of 1.5 μm and thereafter baked at 90° C. on a hotplate for 1 minute.

Following irradiation with excimer light of wavelength 248 nm the wafer is subjected to the usual postexposure bake for these photosystems, 1 minute at 90° C., and then developed. After development, the resist structures on the silicon wafer are assessed and the remaining residual layer thicknesses measured with an α-step profilometer.

The results are shown in Table 2.

TABLE 2

| The aqueous developer contains: | | | Results | |
|---|---|---|---|---|
| % of methyl-diethanolamine | % of TMAH | Sensitivity [mJ/cm²] | % of residual layer | $\Gamma_p$ |
| 15 | 1.0 | 70 | 0 | 6.8 |
| 15 | 1.5 | 33 | 3 | 9.6 |
| 5 | 1.5 | 50 | 0 | 11 |
| 10 | 1.5 | 50 | 1 | 10 |
| 20 | 1.5 | 55 | 3 | 3.4 |

EXAMPLE 3

A photoresist system is pretreated as described in Example 2. The silicon oxide wafer thus prepared is then structured in the developer formulations of Table 3.

Scanning electron micrographs show that patterns having a line width of less than 0.5 μm have been cleanly developed.

TABLE 3

| The aqueous developer contains: | | | Results | |
|---|---|---|---|---|
| % of 3-dimethyl-amino-1-propyl-amine | % of TMAH | Sensitivity [mJ/cm²] | % of residual layer | $\Gamma_p$ |
| 5 | 1.0 | 58 | 0 | 4.1 |
| 10 | 1.0 | 50 | 5 | 4.1 |
| 15 | 1.0 | 42 | 13 | 5.7 |

The developer system consisting of 1.0% of tetramethylammonium hydroxide and 5% of 3-dimethylamino-1-propylamine is found after development and cleaning with deionized water to have left the following residual layer thicknesses (measured with an interferometer):

| Irradiation energy [mJ/cm²] | Residual layer [%] |
|---|---|
| 2.10 | 100 |
| 9.10 | 100 |
| 18.20 | 100 |
| 29.4 | 100 |
| 37.28 | 75.4 |
| 41.83 | 58.9 |
| 47.1 | 20.9 |
| 66.5 | 0 |
| 76 | 0 |
| 112 | 0 |

EXAMPLE 4

The photoresist system treated as described in Example 2 is found after photolithographic structuring and development in a solution consisting of 1.0% of tetramethylammonium hydroxide and 5% of N-(2-hydroxyethyl)piperidine to have left the following residual layer thicknesses:

| Irradiation energy [mJ/cm$^2$] | Residual layer [%] |
|---|---|
| 2.10 | 100 |
| 9.10 | 100 |
| 25.2 | 100 |
| 29.4 | 94.7 |
| 33.3 | 78.7 |
| 37.28 | 50.4 |
| 41.83 | 33.6 |
| 47.08 | 13.7 |
| 66.5 | 0 |
| 76 | 0 |
| 83 | 0 |

Further results are documented in Table 4:

TABLE 4

| | The aqueous developer contains: | | Results | |
|---|---|---|---|---|
| % of N-(2-hydroxyethyl)-piperidine | % of TMAH | Sensitivity [mJ/cm$^2$] | % of residual layer | $\Gamma_p$ |
| 5 | 1.0 | 52 | 0 | 3.7 |
| 10 | 1.0 | 47 | 9 | 4.4 |
| 15 | 1.0 | 47 | 12 | 3.9 |
| 15 | 0.5 | 50 | 3 | 4.5 |

EXAMPLE 5

The developer system consisting of 2% of tetramethylammonium hydroxide and 3-amino-1-propylamine likewise gives very good results. Again no undesirable deposits were found on the structured wafers following development. A mixture of 2.0% of tetramethylammonium hydroxide and 10% of 3-amino-1-propylamine is particularly suitable. Following use of this formulation the following residual layer thicknesses were found with the profilometer:

| Irradiation energy [mJ/cm$^2$] | Residual layer [%] |
|---|---|
| 2.1 | 98.4 |
| 18.2 | 97.5 |
| 29.4 | 79.8 |
| 33.3 | 61.4 |
| 41.83 | 32.8 |
| 47.01 | 15.1 |
| 56.53 | 0 |
| 66.5 | 0 |
| 76 | 0 |

Further results with these developer formulations are listed in Table 5.

TABLE 5

| | The aqueous developer contains: | | Results | |
|---|---|---|---|---|
| % of 3-amino-1-propylamine | % of TMAH | Sensitivity [mJ/cm$^2$] | % of residual layer | $\Gamma_p$ |
| 10 | 2.0 | 54 | 0.7 | 3.3 |
| 15 | 2.0 | 52 | 12 | 3.5 |
| 20 | 2.0 | 48 | 28 | 2.9 |

EXAMPLE 6

The photoresist system prepared as described in Example 1 is developed by immersion for 1 minute in a developer consisting of 1.5% of tetramethylammonium hydroxide, 5% of triethanolamine and 3% of butylglycol at 21° C.

Following cleaning with deionized water, the following residual layer thicknesses were measured with the profilometer:

| Irradiation energy [mJ/cm$^2$] | Residual layer [%] |
|---|---|
| 2.1 | 100 |
| 9.1 | 100 |
| 18.2 | 100 |
| 22.4 | 100 |
| 25.2 | 100 |
| 37.2 | 98.3 |
| 47.1 | 95.5 |
| 56.5 | 78.5 |
| 66.5 | 53.77 |
| 94 | 0 |
| 112 | 0 |

Any depletion in the nonirradiated photoresist due to this developer is hardly measurable and the surface is completely smooth following development. The contrast achieved with this formulation is unexpectedly high; it is 5.7. By increasing the butylglycol concentration it is possible to increase the gamma value still further, but in that case the nonirradiated photoresist is also attacked.

COMPARATIVE EXAMPLE

A positive-working photoresist is initially treated as described in Example 2. Following irradiation with excimer light of wavelength 248 nm and the postexposure bake, the wafers are dipped into a 2.0% strength tetramethylammonium hydroxide solution containing no amines and a 2.0% strength developer containing an amine.

The results are listed in the table:

| | Layer thickness [μm] following development with | |
|---|---|---|
| Irradiation energy [mJ/cm$^2$] | 2.0% of TMAH (= comparison) | 2.0% of TMAH + 10% of methyldiethanolamine (= according to the present invention) |
| 1.26 | 1.51 | 1.50 |
| 5.5 | 1.51 | 1.50 |
| 11.0 | 1.50 | 1.46 |
| 13.4 | 1.46 | 1.16 |
| 15.11 | 1.46 | 0.61 |
| 22.41 | 1.35 | 0.37 |
| 25.1 | 1.35 | 0 |
| 28.0 | very poor adhesion, test areas not measurable | 0 |
| 45.0 | | 0 |

Development with a 2.0% strength tetramethylammonium hydroxide solution does not give completely developed relief structures. The resist image and the bared substrate show resist deposits. It is also noticeable that developers without amines have an adverse effect on resist adhesion.

If about 10% of an amine, e.g. methyldiethanolamine, are added to the 2.0% strength tetramethylammonium hydroxide solution, the developer characteristics change. The flank profile of the structures becomes steep, there are no longer any resist deposits and the resist adhesion is improved.

We claim:

1. A process for developing a positive-working photoresist which contains as a radiation-sensitive layer a mixture of at least one poly(p-hydroxystyrene) or an acid-labile group substituted poly(p-hydroxystyrene) and at least one sulfonium salt having an acid-labile group, which comprises developing the radiation-sensitive layer with an aqueous developer with basic organic compounds to form a positive resist image, following imagewise irradiation, wherein the basic organic compound content comprises from 0.3 to 5% by weight of a tetraalkylammonium hydroxide having from 1 to 3 carbon atoms in the unsubstituted or hydroxylsubstituted alkyl groups and from 3 to 30% by weight of at least one amine of the formula (I)

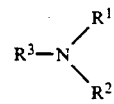

where $R^1$, $R^2$ and $R^3$ are identical or different and each is hydrogen, alkyl of from 1 to 3 carbon atoms, hydroxyalkyl of 2 or 3 carbon atoms, or aminoalkyl of 2 or 3 carbon atoms, or two of $R^1$ to $R^3$ combine to form a 5-, 6- or 7-membered N-containing ring, with the proviso that at least one of $R^1$ to $R^3$ is hydroxyalkyl or aminoalkyl.

2. A process as defined in claim 1, wherein the amine of the formula (I) is diethanolamine, N-methyldiethanolamine, triethanolamine or an aminopropanol.

3. A process as defined in claim 1, wherein the amine of the formula (I) is 3-amino-1-propylamine, 3-dimethylamino-1-propylamine or an N-hydroxyalkylpiperidine.

4. A process as defined in claim 1, wherein the aqueous developer additionally contains up to 5% by weight of an alcohol of 2 or 4 carbon atoms or of a water-soluble glycol ether.

5. A process as defined in claim 4, wherein the amine of the formula (I) is 3-amino-1-propylamine, 3-dimethylamino-1-propylamine or an N-hydroxyalkylpiperidine.

* * * * *